(12) United States Patent
Lee et al.

(10) Patent No.: US 8,907,400 B2
(45) Date of Patent: Dec. 9, 2014

(54) 3-D NON-VOLATILE MEMORY DEVICE AND METHOD OF MANUFACTURING THE SAME

(75) Inventors: Seo Hyun Lee, Seoul (KR); Byung Soo Park, Gyeonggi-do (KR); Sang Hyun Oh, Gyeonggi-do (KR); Sun Mi Park, Gyeongbuk (KR)

(73) Assignee: SK Hynix Inc., Gyeonggi-do (KR)

( * ) Notice: Subject to any disclaimer, the term of this patent is extended or adjusted under 35 U.S.C. 154(b) by 31 days.

(21) Appl. No.: 13/455,464

(22) Filed: Apr. 25, 2012

(65) Prior Publication Data

US 2012/0273865 A1   Nov. 1, 2012

(30) Foreign Application Priority Data

Apr. 26, 2011 (KR) .................. 10-2011-0038985

(51) Int. Cl.
*H01L 29/792* (2006.01)
*H01L 27/115* (2006.01)

(52) U.S. Cl.
CPC ...... *H01L 27/11582* (2013.01); *H01L 29/7926* (2013.01)
USPC ................. 257/324; 257/E29.309; 257/329

(58) Field of Classification Search
CPC .................................. H01L 21/28282
USPC ........................................... 257/324
See application file for complete search history.

(56) References Cited

U.S. PATENT DOCUMENTS

2011/0291177 A1* 12/2011 Lee et al. ............... 257/324
2012/0008400 A1*  1/2012 Fukuzumi et al. ...... 365/185.18

FOREIGN PATENT DOCUMENTS

JP   2010-199314      9/2010
KR   1020100106911   10/2010

OTHER PUBLICATIONS

Notice of Allowance issued by the Korean Intellectual Property Office on Nov. 7, 2012.

* cited by examiner

*Primary Examiner* — Victor A Mandala
*Assistant Examiner* — Christopher Johnson
(74) *Attorney, Agent, or Firm* — IP & T Group LLP

(57) ABSTRACT

A three dimensional (3-D) non-volatile memory device includes a pipe gate including a first pipe gate, a second pipe gate formed on the first pipe gate, and a first interlayer insulating layer interposed between the first pipe gate and the second pipe gate, word lines alternately stacked with second interlayer insulating layers on the pipe gate, a pipe channel buried within the pipe gate, and memory cell channels coupled to the pipe channel and arranged to pass through the word lines and the second interlayer insulating layers.

6 Claims, 7 Drawing Sheets ced on Apr. 26, 2011, the entire disclosure of which is incorporated by reference herein, is claimed.

3-D NON-VOLATILE MEMORY DEVICE AND METHOD OF MANUFACTURING THE SAME

CROSS-REFERENCE TO RELATED APPLICATION

Priority to Korean patent application number 10-2011-0038985 filed on Apr. 26, 2011, the entire disclosure of which is incorporated by reference herein, is claimed.

BACKGROUND

Exemplary embodiments relate to a semiconductor device and a method of manufacturing the same and, more particularly, to a non-volatile memory device having a three-dimensional (3-D) structure and a method of manufacturing the same.

A non-volatile memory device retains data stored therein even though the supply of power is stopped. As an increase in the degree of integration of two-dimensional (2-D) structured memory devices fabricated on a silicon substrate as a single layer is reaching physical limits, a 3-D non-volatile memory device in which memory cells are stacked in a vertical direction to the silicon substrate has been developed.

The structure of the conventional 3-D non-volatile memory device and features thereof are described in detail with reference to FIGS. 1 and 2.

FIGS. 1A to 1C are cross-sectional views illustrating a method of manufacturing the conventional 3-D non-volatile memory device. Particularly, FIGS. 1A to 1C are cross-sectional views of a non-volatile memory device of a U-shaped channel type in which strings are arranged in a U shape.

As shown in FIG. 1A, an insulating layer 11 is formed on a substrate 10, and a conductive layer 12 is formed on the insulating layer 11. The conductive layer 12 is used to form the pipe gate of a pipe transistor.

A first trench is formed by etching the conductive layer 12, and a first sacrificial layer 13 is formed in the first trench. The first trench is used to form a U-shaped pipe channel.

First interlayer insulating layers 14 and first conductive layers 15 are alternately formed on the resulting structure in which the first sacrificial layer 13 is buried. The first conductive layers 15 are used to form word lines.

A second conductive layer 16 and a second interlayer insulating layer 17 are formed on the first interlayer insulating layers 14 and the first conductive layers 15. The second conductive layer 16 is used to form the select gates of select transistors.

A pair of second trenches coupled to the first trench is formed by etching the second interlayer insulating layer 17, the second conductive layer 16, the first interlayer insulating layers 14, and the first conductive layers 15. The second trenches are used to form the channel of memory cells and the channel of the select transistors.

As shown in FIG. 1B, the first sacrificial layer 13 exposed under the pair of second trenches is removed.

Next, a charge blocking layer, a charge trap layer, and a tunnel insulating layer, hereinafter collectively denoted by reference numeral 18, are formed on the inner surface of the first trench and the pair of second trenches. A channel layer 19 having a central region opened is formed on the charge blocking layer, the charge trap layer, and the tunnel insulating layer 18. Accordingly, a U-shaped channel, including the pipe channel formed in the first trench and a pair of first channels formed in the pair of second trenches, is formed.

As shown in FIG. 1C, an insulating layer 20 is buried in the opened central region of the U-shaped channel. The insulating layer 20 is recessed to a specific depth, and conductive plugs 21 are formed in the recessed regions. The conductive plugs 21 are formed of polysilicon layers doped with N type impurities of a high concentration. The gates of the select transistors overlap with the conductive plugs 21, thus forming a junction doped with the N type impurities of a high concentration.

The erase operation of the 3-D non-volatile memory device constructed as above is performed in a depletion mode in which holes generated due to Gate Induced Drain Leakage (GIDL) in the junction are used in the erase operation. That is, the erase operation is performed in such a manner that the holes generated by GIDL are moved along the channel layer 19 and subsequently injected into the charge trap layers of the memory cells. Accordingly, in order for the conventional 3-D non-volatile memory device to adequately perform an erase operation, a sufficient number of holes are to be generated. To this end, the degree of overlap between the gates of source select transistors and the junction is to be properly controlled. If the source gate excessively overlaps with the junction, leakage may occur in the source select transistors.

FIG. 2 is a cross-sectional view of the conventional 3-D non-volatile memory device. Features of the conventional 3-D non-volatile memory device are described with reference to FIG. 2.

In the conventional 3-D non-volatile memory device, as described above, the conductive plugs 21 doped with impurities of a high concentration are formed on the upper part of the U-shaped channel, and the erase operation is performed in the depletion mode.

The conductive plugs 21 are formed by depositing a polysilicon layer and subsequently implanting the ions of impurities or depositing polysilicon doped with impurities of a high concentration. This process has the following features.

First, it is difficult to etch the insulating layer 20 buried in the opened central region of the channel. Here, in selectively etching, for example, only the insulating layer 20 without damaging the existing peripheral layers in the recess process, it is difficult to control the etching amount of the insulating layer 20. Accordingly, the insulating layers 20 of a plurality of strings may have irregular depths as shown in FIG. 2. In this case, the characteristic of the memory device is deteriorated because the conductive plug 21 irregularly overlaps with a source gate.

Second, if the ions of impurities are implanted after the polysilicon layer is deposited, it is not easy to control the diffusion of the impurities. If the ions of the impurities are implanted into the conductive plugs, process control is difficult because the diffusion of the impurities is to be controlled in a vertical direction, not a horizontal direction. Accordingly, controlling the overlap of the source gate and the junction is difficult.

Third, if polysilicon doped with impurities of a high concentration is to be deposited, the commercialization of the process, which is not frequently used, is difficult.

Fourth, if the erase operation is performed in the depletion mode, there is a variation of the erase speed between adjacent word lines or adjacent strings, and the swing characteristic of a select transistor deteriorates.

BRIEF SUMMARY

Exemplary embodiments relate to a 3-D non-volatile memory device driven in an enhanced mode and a method of manufacturing the same.

A 3-D non-volatile memory device according to an aspect of the present disclosure includes a pipe gate including a first pipe gate, a second pipe gate formed on the first pipe gate, and a first interlayer insulating layer interposed between the first pipe gate and the second pipe gate, word lines alternately stacked with second interlayer insulating layers on the pipe gate, a pipe channel buried within the pipe gate, and memory cell channels coupled to the pipe channel and arranged to pass through the word lines and the second interlayer insulating layers.

A method of manufacturing a 3-D non-volatile memory device according to another aspect of the present disclosure includes sequentially forming a first conductive layer, a first interlayer insulating layer, and a second conductive layer, etching the second conductive layer and the first interlayer insulating layer and subsequently forming a first trench by etching the first conductive layer to a specific thickness, forming third conductive layers alternately with second interlayer insulating layers on a resulting structure in which the first trench is formed insulating, etching the third conductive layers and the second interlayer insulating layers to form second trenches coupled to the first trench, and forming a first channel layer in the first trench and the second trenches.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

FIGS. 3A to 3F are cross-sectional views illustrating a method of manufacturing a 3-D non-volatile memory device according to a first embodiment of this disclosure.

Figure 1A:
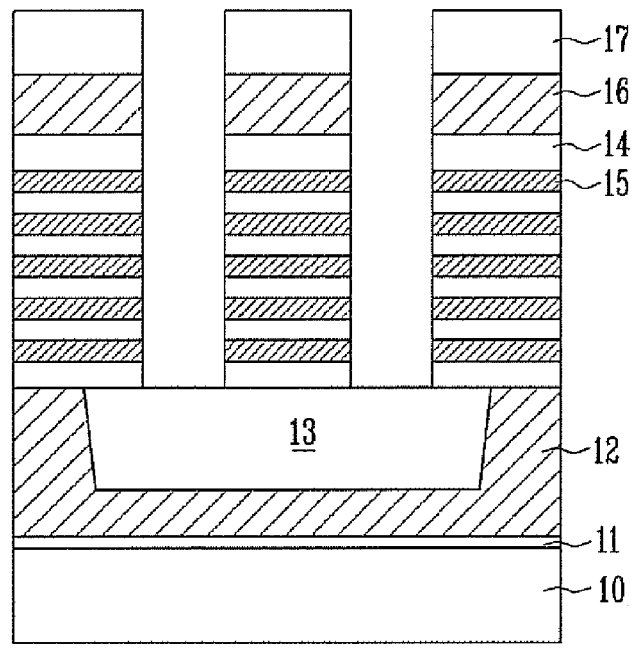
FIGS. 1A to 1C are cross-sectional views illustrating a method of manufacturing a conventional 3-D non-volatile memory device.
Figure 1B:
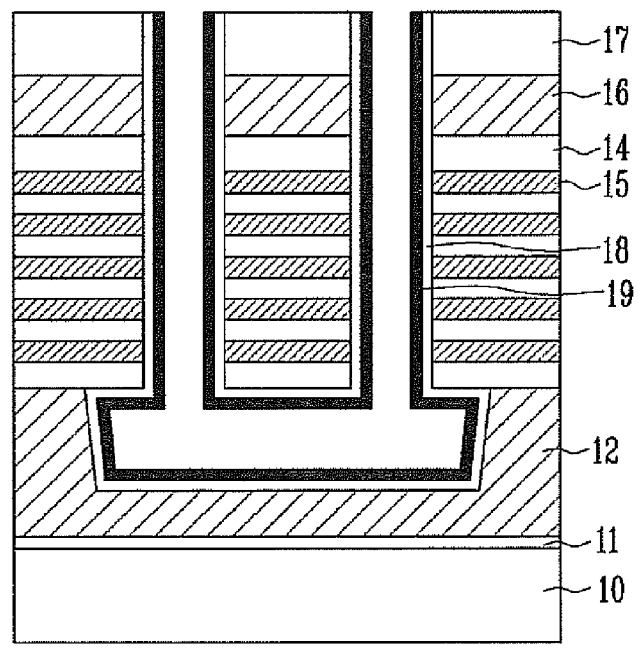
Figure 1C:
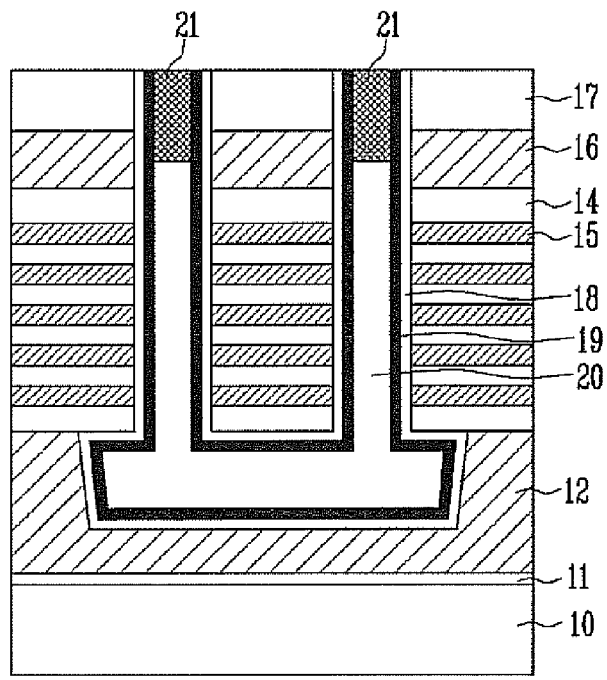
Figure 2:
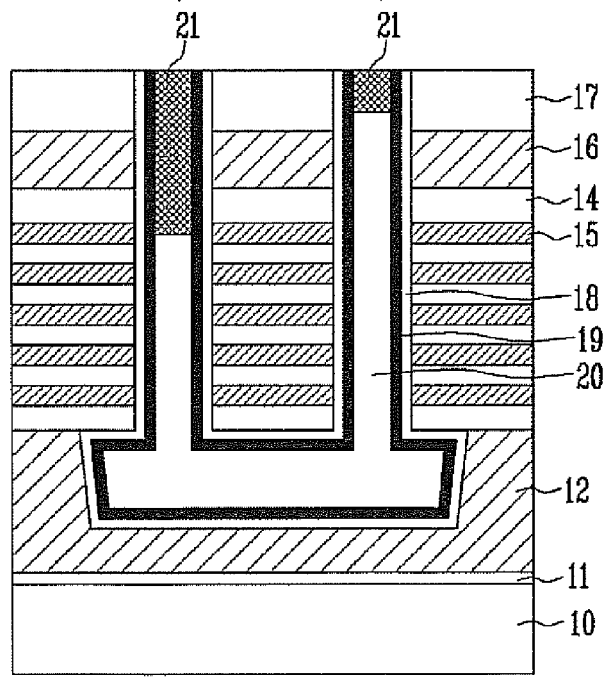
FIG. 2 is a cross-sectional view of the conventional 3-D non-volatile memory device.
Figure 3A:
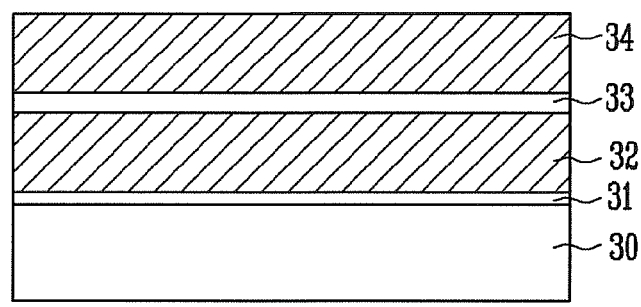
FIGS. 3A to 3F are cross-sectional views illustrating a method of manufacturing a 3-D non-volatile memory device according to a first embodiment of this disclosure.

As shown in FIG. 3A, after a first interlayer insulating layer 31 is formed on a substrate 30, a first conductive layer 32, a second interlayer insulating layer 33, and a second conductive layer 34 are sequentially formed on the first interlayer insulating layer 31. The first conductive layer 32 is used to form a first pipe gate, and the second conductive layer 34 is used to form a second pipe gate. The first pipe gate and the second pipe gate may be formed to include different types of impurities. For example, the first conductive layer 32 may be formed of a polysilicon layer doped with P type impurities of a high concentration, and the second conductive layer 34 may be formed of a polysilicon layer doped with N type impurities of a high concentration.

Figure 3B:
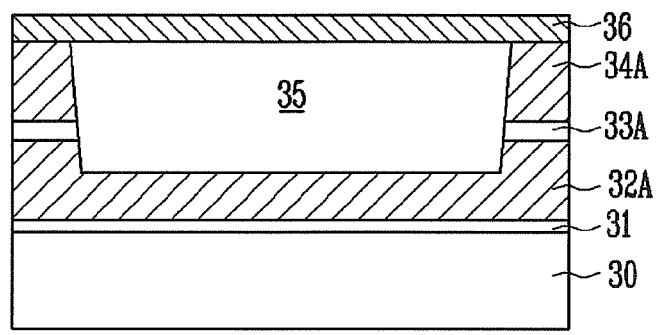

As shown in FIG. 3B, after the second conductive layer 34 and the second interlayer insulating layer 33 are etched, a first trench is formed by etching the first conductive layer 32 to a specific desired thickness. The first trench is formed to secure a region where a pipe channel will be formed. The first conductive layer 32 is exposed by the first trench. Hereinafter, the etched first conductive layer is referred to as a first pipe gate 32A, and the etched second conductive layer is referred to as a second pipe gate 34A. In this drawing, the etched second interlayer insulating layer is denoted by reference numeral '33A'.

A first sacrificial layer 35 is formed on the resulting structure in which the first trench is formed. The first sacrificial layer 35 is buried in the first trench by performing a polishing process. The first sacrificial layer 35 may be formed of an oxide layer.

A conductive layer 36 for protection may be formed on the resulting structure in which the first sacrificial layer 35 is buried. The conductive layer 36 for protection functions to enhance an electric field of the pipe gate and may be formed of a polysilicon layer. If the conductive layer 36 for protection is formed as described above, an electric field between the pipe gate and the lowest word line can be enhanced.

Figure 3C:
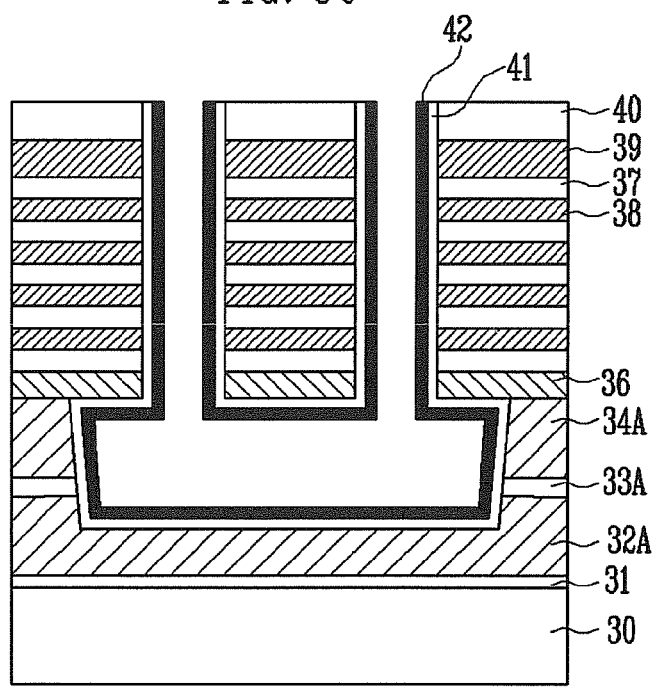

As shown in FIG. 3C, first material layers (e.g., third conductive layers 38) and second material layers (e.g., third interlayer insulating layers 37) are alternately formed on the resulting structure in which the conductive layer 36 for protection is formed. The first material layers and the second material layers are made of material having a high etch selectivity. In the present embodiment, an example in which the first material layer is a third conductive layer 38 and the second material layer is a third interlayer insulating layer 37 is described. The third conductive layers 38 are used to form word lines and may be formed of polysilicon layers. Furthermore, the third interlayer insulating layers 37 are used to separate memory cells, stacked over the substrate, from each other and may be formed of oxide layers.

Next, a fourth conductive layer 39 and a fourth interlayer insulating layer 40 are formed on the resulting structure in which the third conductive layers 38 and the third interlayer insulating layers 37 are formed. The fourth conductive layer 39 is used to form a select line and may be formed of a polysilicon layer.

Second trenches coupled to the first trench are formed by etching the fourth interlayer insulating layer 40, the fourth conductive layer 39, the third conductive layers 38, and the third interlayer insulating layers 37. The second trenches are formed to secure the channel region of the memory cells and the channel region of select transistors. At least pair of the second trenches may be formed in each of the first trenches.

Next, the first sacrificial layer 35 exposed by the second trenches is removed. Next, a charge blocking layer, a charge trap layer, and a tunnel insulating layer, hereinafter collectively denoted by reference numeral 41, are formed on the inner surface of the first trench and the second trenches.

A first channel layer 42 is formed on the charge blocking layer, the charge trap layer, and the tunnel insulating layer 41. The first channel layer 42 may be formed of a polysilicon layer.

Figure 3D:
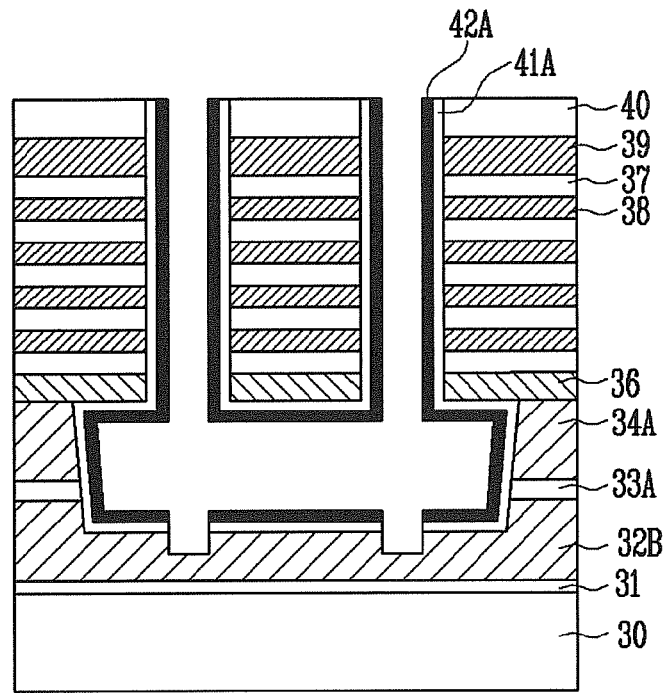

As shown in FIG. 3D, part of the bottom of the first trench is exposed by etching the first channel layer 42 and the charge blocking layer, the charge trap layer, and the tunnel insulating layer 41 exposed under the second trenches. The exposed first pipe gate 32A is subsequently etched to a specific thickness. Thus, protrusions protruded into the first pipe gate 32A are formed at the bottom of the first trench. In this drawing, the etched first channel layer is denoted by reference numeral '42A', the etched charge blocking layer, the etched charge trap layer, and the etched tunnel insulating layer are collectively denoted by reference numeral '41A', and the etched first pipe gate is denoted by reference numeral '32B'.

Here, according to an example, the etch process be performed using an anisotropic etch process. Furthermore, the first channel layer 42A may function as a kind of a protection layer when the etch process is performed. The first channel layer 42A functions to prevent the charge blocking layer, the charge trap layer, and the tunnel insulating layer 41A from being damaged.

Figure 3E:
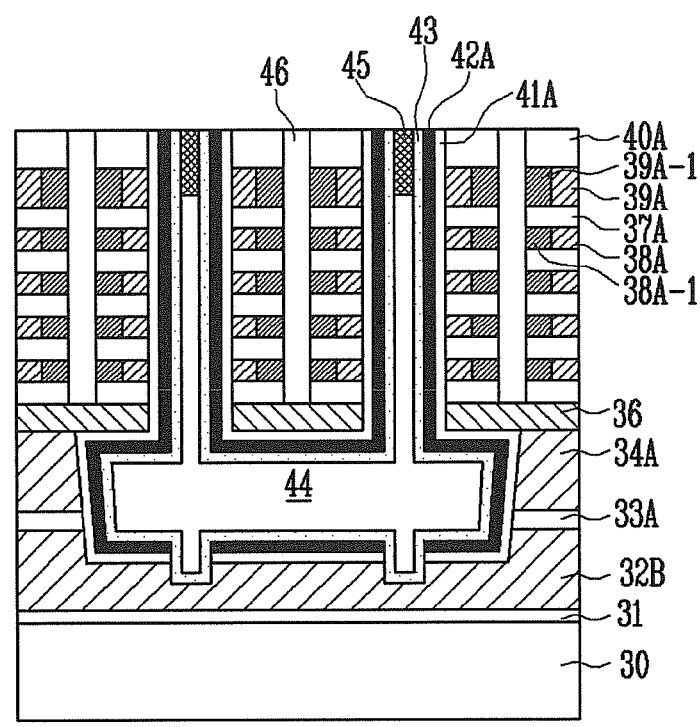

As shown in FIG. 3E, a second channel layer 43 is formed in the first trench, having the protrusions formed at its bottom, and the second trenches. The second channel layer 43 is formed on the charge blocking layer, the charge trap layer, and the tunnel insulating layer 41A. The second channel layer 43 is also formed in the protrusions and is directly coupled to the first pipe gate 32B.

The first channel layer 42A may be damaged when the anisotropic etch process is performed. A channel layer with a good quality can be formed by forming the second channel layer 43 as described above.

Thus, a U-shaped channel, including the first channel layer 42A and the second channel layer 43, is formed. Here, the first channel layer 42A and the second channel layer 43 formed within the first trench form a pipe channel, and the first channel layer 42A and the second channel layer 43 formed within the second trenches form the channel of the memory cells and the channels of the select transistors.

In accordance with another embodiment, the first channel layer 42A may be removed before the second channel layer 43 is formed. If the first channel layer 42A is removed, damage to the first channel layer 42A or the contamination of an interface of the charge blocking layer, the charge trap layer, and the tunnel insulating layer 41A may be prevented. For example, the first channel layer 42A may be removed using a cleaning process or may be removed using a dry etch process in order to minimize damage to the tunnel insulating layer.

A first insulating layer 44 is formed on the resulting structure in which the second channel layer 43 is formed and subsequently buried in the first trench and the pair of second trenches by a polishing process. The first insulating layer 44 may be formed of a polysilazane (PSZ) layer.

Regions where conductive plugs 45 will be formed are secured by recessing the first insulating layer 44 to a specific depth. According to an example, the recess process be performed using a wet cleaning process. Furthermore, since the overlap of the select line and the junction is determined depending on the recessed depth, the recess process is performed by taking the thickness of the fourth interlayer insulating layer 40 and the fourth conductive layer 39 into consideration.

Next, the conductive plugs 45 are formed in the respective recessed regions. According to an example, the conductive plug 45 may be formed of a polysilicon layer doped with N type impurities of a high concentration.

Next, a slit (for example, the space where a second insulating layer 46 is to be formed) is formed between the second channel trenches adjacent to each other by etching the fourth interlayer insulating layer 40, the fourth conductive layer 39, the third conductive layers 38, and the third interlayer insulating layers 37. Accordingly, adjacent memory cells or adjacent memory blocks are separated from each other by the slit, and the select lines 39A formed in at least one layer and the word lines 38A stacked in multiple layers are formed. In this drawing, the etched fourth interlayer insulating layer is denoted by reference numeral '40A, the etched fourth conductive layer is denoted by reference numeral '39A', the etched third conductive layers are denoted by reference numeral '38A', and the etched third interlayer insulating layers are denoted by reference numeral '37A'.

Next, the select lines 39A and the word lines 38A exposed by the inner surfaces of the slits are silicided to a specific thickness. For example, after a metal layer is formed in the plurality of slits, the select lines 39A and the word lines 38A may be silicided to a specific thickness by an annealing process. In this drawing, the silicided regions of the select lines 39A are denoted by reference numeral '39A-1', and the silicided regions of the word lines 38A are denoted by reference numeral '38A-1'.

The metal layer remaining within the slits are removed, and a second insulating layer 46 is subsequently buried in the slits.

Figure 3F:
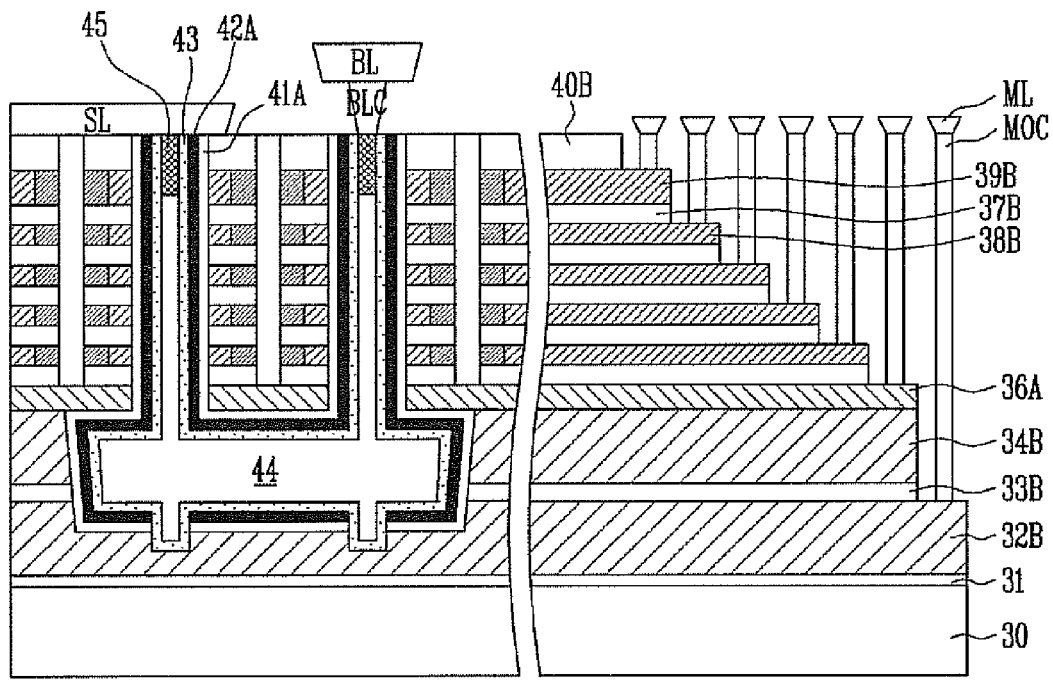

As shown in FIG. 3F, a bit line contact plug BLC and a bit line BL are coupled to one of the two select lines 39A included in one string, and a source line SL is coupled to the other of the two select lines 39A. Although only one string is shown in FIG. 3F, the source line SL is shared by adjacent strings.

Next, the fourth interlayer insulating layer 40A, the fourth conductive layer 39A, the plurality of third conductive layers 38A, the plurality of third interlayer insulating layers 37A, the second pipe gate 34A, and the second interlayer insulating layer 33A (FIG. 3E) are stepwise patterned so that the surfaces of the select lines 39A, the word lines 38A, the second pipe gate 34A, and the first pipe gate 32A are exposed.

In the patterning process, the first pipe gate 32B may also be etched. Furthermore, if the conductive layer 36 for protection is formed on the second pipe gate 34A, the conductive layer 36 for protection and the second pipe gate 34A may be stepwise patterned so that the surface of the conductive layer 36 for protection is exposed because the conductive layer 36 for protection and the second pipe gate 34A are electrically coupled.

In this drawing, the etched fourth interlayer insulating layer is denoted by reference numeral '40B', the etched select lines are denoted by reference numeral '39B', the etched word lines are denoted by reference numeral '38B', the etched third interlayer insulating layers are denoted by reference numeral '37B', the etched conductive layer for protection is denoted by reference numeral '36A', the etched second pipe gate is denoted by reference numeral '34B', and the etched second interlayer insulating layer is denoted by reference numeral '33B'.

A third insulating layer (not shown) is formed on the entire surface of the resulting structure that has been stepwise patterned. Contact holes, coupled to the select lines 3913, the word lines 37B, the second pipe gate 34B, and the first pipe gate 32B, respectively, are formed by etching the third insulating layer.

Next, a fifth conductive layer is formed on the resulting structure in which the contact holes are formed. A plurality of contact plugs M0C for metal lines ML, coupled to the select lines 39B, the word lines 38B, the second pipe gate 34B, and the first pipe gate 32B, respectively, is formed by performing a polishing process.

Next, the metal lines ML coupled to the respective contact plugs M0C are formed. The contact plugs M0C are coupled to respective driving circuits through the metal lines ML.

As described above, in accordance with an exemplary embodiment of this disclosure, the pipe gate, including the first pipe gate 32B and the second pipe gate 33B, is formed. A bias is directly supplied to the first pipe gate 32B and the second pipe gate 34B through the contact plugs M0C. For example, in an erase operation, an erase voltage is supplied to the first pipe gate 32B and the second pipe gate 34B. In a read operation, a read voltage is supplied to the first pipe gate 32B, and the second pipe gate 34B is grounded. Furthermore, in a program operation, a pass voltage is supplied to the first pipe gate 32B, and the second pipe gate 34B is grounded.

Accordingly, the 3-D non-volatile memory device can be driven in an enhanced mode, and thus the efficiencies of an erase operation, a read operation, and a program operation can be improved. Furthermore, the 3-D non-volatile memory device according to an exemplary embodiment of this disclosure has an improved performance with respect to an erase operation in a depletion mode, variation of the erase speed between adjacent word lines or adjacent strings, the swing characteristics of a select transistor, and so on.

Meanwhile, in accordance with the present embodiment, the process of etching the exposed first pipe gate 32A (FIGS. 3C and 3D) to a specific thickness after the first channel layer 42 and the charge blocking layer, the charge trap layer, and the tunnel insulating layer 41 exposed under the pair of second trenches are etched may be omitted. In this case, the protrusions protruded into the first pipe gate 32A are not formed, and the entire surface of the first channel layer 42 is surrounded by the charge blocking layer, the charge trap layer and the tunnel insulating layer 41. In particular, the first pipe gate doped with P type impurities of a high concentration and the second pipe gate doped with N type impurities of a high concentration may be formed, and part of the pipe channel may be directly coupled to the first pipe gate.

In accordance with this structure, the first pipe gate may function as a source of holes like a P-well of a floating gate type non-volatile memory device. Furthermore, since a bias can be supplied to each of the first pipe gate 32A and the second pipe gate 34A, an erase operation, a read operation, and a program operation may be efficiently performed. Particularly, disturbance due to the lowest word line may be reduced by controlling the same bias or different biases to the first pipe gate 32A and the second pipe gate 34A.

Figure 4A:
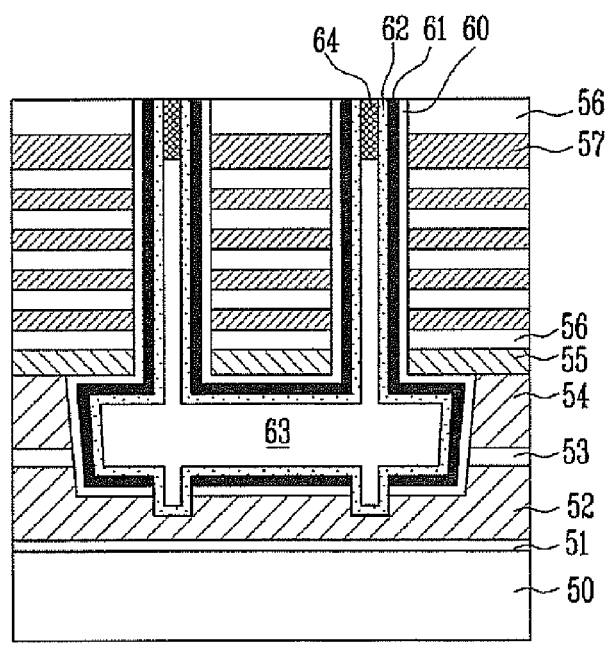
FIGS. 4A to 4C are cross-sectional views illustrating a method of manufacturing a 3-D non-volatile memory device according to a second embodiment of this disclosure.
Figure 4B:
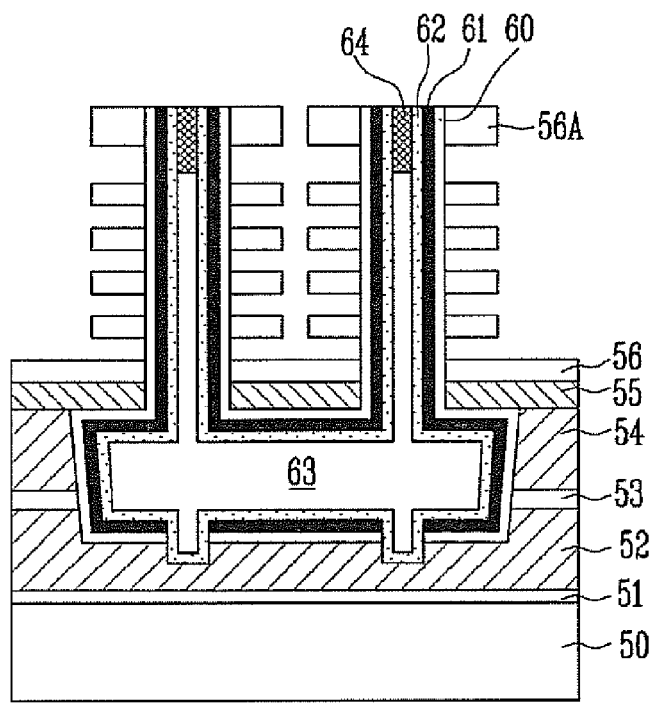
Figure 4C:
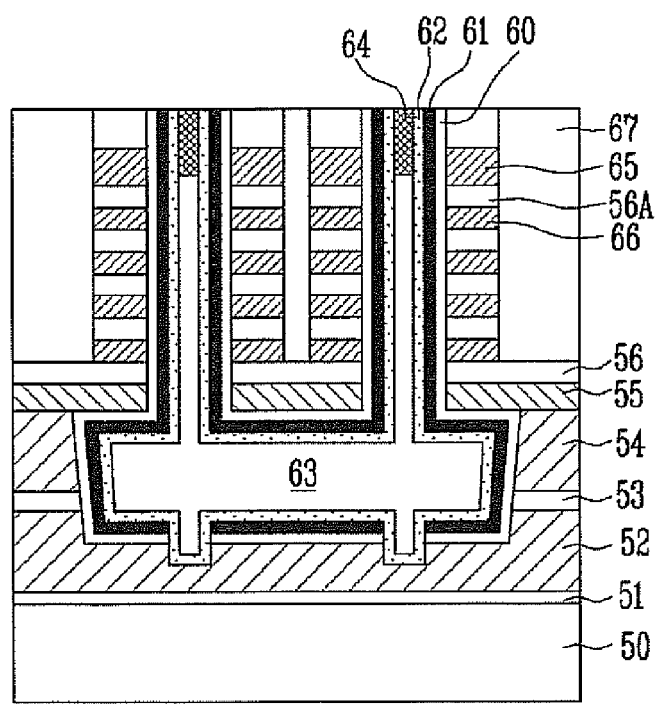

FIGS. 4A to 4C are cross-sectional views illustrating a method of manufacturing a 3-D non-volatile memory device according to a second embodiment of this disclosure. Here, a description of the contents of the second embodiment, overlapping with those of the first embodiment, is omitted.

As shown in FIG. 4A, a first interlayer insulating layer 51, a first conductive layer 52, a second interlayer insulating layer 53, and a second conductive layer 54 are formed on a substrate 50. A first trench is formed by etching the second conductive layer 54, the second interlayer insulating layer 53, and the first conductive layer 52. Hereinafter, the etched first conductive layer is referred to as a first pipe gate 52, and the etched second conductive layer is referred to as a second pipe gate 54.

A first sacrificial layer (not shown) is buried in the first trench, and a conductive layer 55 for protection is subsequently formed.

First material layers and second material layers are alternately formed on the conductive layer 55 for protection. In the present embodiment, an example in which the first material layer is a sacrificial layer 57 and the second material layer is a third interlayer insulating layer 56 is described. The second sacrificial layers 57 are formed to secure the regions of word lines and the regions of select lines which will be formed in subsequent processes. According to an example, the second sacrificial layer 57 has a high etch selectivity to the third interlayer insulating layer 56. For example, if the third interlayer insulating layer 56 is formed of an oxide layer, the second sacrificial layer 57 may be formed of a nitride layer. Furthermore, each of the second sacrificial layers 57 for securing the regions of the select lines may be thicker than each of other second sacrificial layers 57 for securing the regions of the word lines.

Second trenches coupled to the first trench are formed by etching the third interlayer insulating layers 56 and the second sacrificial layers 57.

The first sacrificial layer of the first trench is exposed by the second trenches and is removed. Next, a charge blocking layer, a charge trap layer, and a tunnel insulating layer, hereinafter collectively denoted by 60, are formed on the inner surface of the first trench and the second trenches.

A first channel layer 61 is formed on the charge blocking layer, the charge trap layer, and the tunnel insulating layer 60. Part of the bottom of the first trench is exposed by etching the first channel layer 61 and the charge blocking layer, the charge trap layer, and the tunnel insulating layer 60 which are exposed under the second trenches. The exposed first pipe gate 52 is etched to a specific thickness.

Next, a second channel layer 62 is formed in the first trench, having the protrusions formed at its bottom, and in the second trenches. In some embodiments, the first channel layer 61 may be removed before the second channel layer 62 is formed.

Next, a first insulating layer 63 is buried in the first trench and the second trenches. Regions where conductive plugs 64 will be formed are secured by recessing the insulating layer 63 to a specific depth. The conductive plugs 64 are formed in the recessed regions.

As shown in FIG. 4B, a slit is formed between the second channel trenches adjacent to each other by etching the third interlayer insulating layers 56 and the second sacrificial layers 57 vertically through the middle. Regions where select lines will be formed and regions where word lines will be formed are formed by removing the second sacrificial layers 57 exposed through the slits. In this drawing, the etched third interlayer insulating layers are denoted by reference numeral '56A'.

In some embodiments, the exposed charge blocking layer may be removed after removing the second sacrificial layers 57, and an additional charge blocking layer may be formed in the select line regions and the word line regions. The charge blocking layer may be formed of a high-k (high insulating constant) material layer, such as an aluminum oxide layer, or may be formed of an silicon oxide layer (SiO2) and an aluminum oxide layer (Al2O3).

As shown in FIG. 4C, select lines 65 and word lines 66 are formed by burying a third conductive layer in the select line regions and the word line regions. The third conductive layer for the select lines 65 and word lines 66 may be formed of a polysilicon layer or a metal layer made of tungsten (W). For example, if the third conductive layer is made of polysilicon, a silicidation process may be performed in order to silicide the select lines and the word lines to a specific thickness.

Next, a second insulating layer 67 is formed within the slits.

Although not shown in the drawings, a bit line formation process, a source line formation process, a stepwise patterning process, a process of forming contact plugs for metal lines, and so on are performed as described above.

In some embodiments, the first material layer may be formed of a conductive layer, such as a doped polysilicon layer or a doped amorphous silicon layer, and the second material layer may be formed of a sacrificial layer, such as an undoped polysilicon layer or an undoped amorphous silicon layer.

In this case, after the slits are formed, the second material layers exposed within the slits are removed. Next, an insulating layer is buried in the regions from which the second material layers have been removed and the slits.

Figure 5:
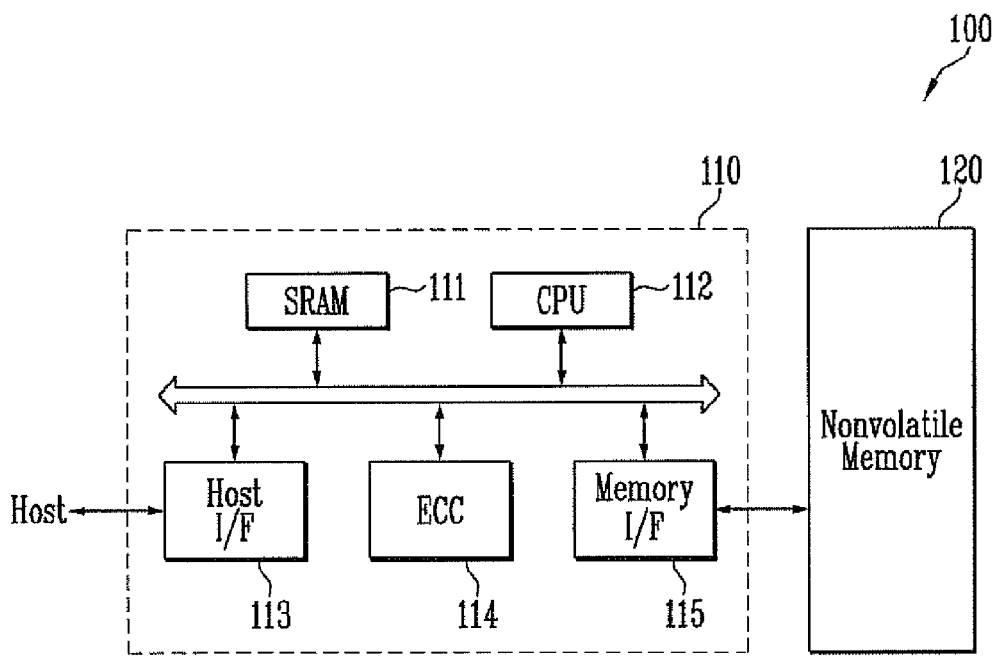
FIG. 5 shows a construction of a memory system according to an embodiment of this disclosure.

FIG. 5 shows a construction of a memory system according to an embodiment of this disclosure As shown in FIG. 5, the memory system 100 according to the embodiment of this disclosure includes a non-volatile memory device 120 and a memory controller 110.

The non-volatile memory device 120 is configured to have a cell array, including the pipe gates and the pipe channel layers described above. In some embodiments, the non-volatile memory device 120 may be a multi-chip package including a plurality of flash memory chips.

The memory controller 110 controls the non-volatile memory device 120 and may include SRAM 111, a Central Processing Unit (CPU) 112, a host interface (I/F) 113, an ECC 114, and a memory I/F 115. The SRAM 111 is used as the operating memory of the CPU 112. The CPU 112 performs an overall control operation for the data exchange of the memory controller 110. The host I/F 113 is equipped with the data exchange protocol of a host coupled to the memory system 100. Furthermore, the ECC 114 detects and corrects errors included in data read out from the non-volatile memory device 120. The memory I/F 115 performs an interface with the non-volatile memory device 120. The memory controller 110 may further include an RCM for storing code data for an interface with the host.

The memory system 100 constructed as described above may be a memory card or a Solid State Disk (SSD) in which the non-volatile memory device 120 and the controller 110 are combined. For example, if the memory system 100 is an SSD, the memory controller 110 may communicate with the outside (e.g., a host) through one of various interface protocols, such as USB, MMC, PCI-E, SATA, PATA, SCSI, ESDI, and IDE.

Figure 6:
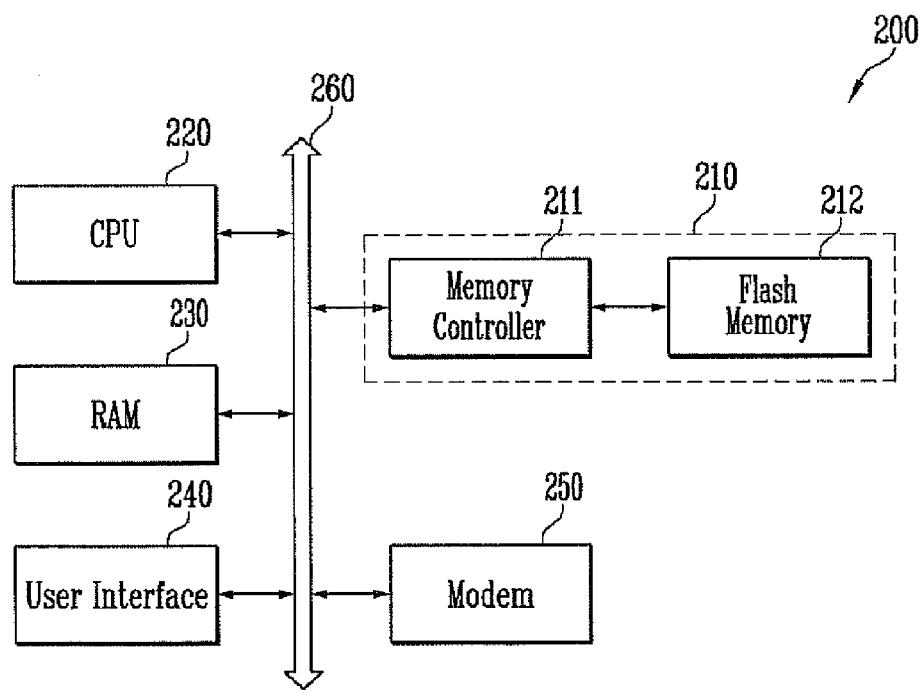
FIG. 6 shows a construction of a computing system according to an embodiment of this disclosure.

FIG. 6 shows a construction of a computing system according to an embodiment of this disclosure.

As shown in FIG. 6, the computing system 200 according to the embodiment of this disclosure may include a CPU 220, RAM 230, a user interface 240, a modem 250, and a memory system 210 electrically coupled a system bus 260. If the computing system 200 is a mobile device, the computing system 200 may further include a battery for supplying operating voltages to the computing system 200. The computing system 200 may further include application chipsets, a Camera Image Processor (CIS), mobile DRAM, and so on.

The memory system 210 may include a non-volatile memory device 212 and a memory controller 211, such as those described above with reference to FIG. 5.

The 3-D non-volatile memory device according an exemplary embodiment of this disclosure includes the pipe gates, including the first pipe gate and the second pipe gate. Accordingly, the 3-D non-volatile memory device may be driven in an enhanced mode.

What is claimed is:

1. A three dimensional (3-D) non-volatile memory device, comprising:
   a pipe gate including a first pipe gate, a second pipe gate formed on the first pipe gate, and a first interlayer insulating layer interposed between the first pipe gate and the second pipe gate;
   word lines alternately stacked with second interlayer insulating layers on the pipe gate;
   a pipe channel buried within the pipe gate and in direct contact with the first pipe gate; and
   memory cell channels coupled to the pipe channel and arranged to pass through the word lines and the second interlayer insulating layers.

2. A three dimensional (3-D) non-volatile memory device, comprising:
   a pipe gate including a first pipe gate, a second pipe gate formed on the first pipe gate, and a first interlayer insulating layer interposed between the first pipe gate and the second pipe gate;
   word lines alternately stacked with second interlayer insulating layers on the pipe gate;
   a pipe channel buried within the pipe gate and a part of the pipe channel extending into the first pipe gate to be directly coupled to the first pipe gate; and
   memory cell channels coupled to the pipe channel and arranged to pass through the word lines and the second interlayer insulating layers.

3. The 3-D non-volatile memory device of claim 2, further comprising a tunnel insulating layer, a charge trap layer, and a charge blocking layer that surround the pipe channel and the memory cell channels other than regions protruded into the first pipe gate.

4. The 3-D non-volatile memory device of claim 3 wherein the pipe channel and the memory cell channels comprise:
   a first channel formed on the tunnel insulating layer, the charge trap layer, and the charge blocking layer; and
   a second channel formed on the first channel, wherein a part of the second channel extends into the first pipe gate and is directly coupled to the first pipe gate.

5. The 3-D non-volatile memory device of claim 1, wherein:
   the first pipe gate comprises P type impurities,
   the second pipe gate comprises N type impurities, and
   the first pipe gate functions as a source of holes in an erase operation.

6. The 3-D non-volatile memory device of claim 1, wherein the pipe channel and the memory cell channels has a pipe form having an open central region and includes:
   an insulating layer buried in the open central region, and
   conductive plugs buried in upper parts of the insulating layer of the open central region.

* * * * *